United States Patent [19]

Brodzik et al.

[11] Patent Number: 4,748,405

[45] Date of Patent: May 31, 1988

[54] CURRENT SENSOR ARRANGEMENT

[75] Inventors: Paul E. Brodzik, Deerfield; Arthur J. Lostumo, Franklin Park, both of Ill.

[73] Assignee: Zenith Electronics Corporation, Glenview, Ill.

[21] Appl. No.: 873,670

[22] Filed: Jun. 12, 1986

[51] Int. Cl.⁴ ............................................. G01R 1/20
[52] U.S. Cl. .................................... 324/127; 336/65; 336/174
[58] Field of Search .................... 324/127; 336/90, 92, 336/174, 199, 200, 208, 65, 175, 196

[56] References Cited

U.S. PATENT DOCUMENTS

| | | | |
|---|---|---|---|
| 2,618,689 | 11/1952 | Cook, Jr. .............................. | 336/174 |
| 2,924,796 | 2/1960 | Stauber et al. ...................... | 336/174 |
| 3,264,591 | 8/1966 | D'Entremont ....................... | 336/174 |
| 3,380,009 | 4/1968 | Miller ................................. | 336/174 |
| 4,507,709 | 3/1985 | Morris et al. ....................... | 336/174 |

FOREIGN PATENT DOCUMENTS 1507300  11/1966  France ............................... 336/174

*Primary Examiner*—Ernest F. Karlsen

[57] ABSTRACT

A toroidal coil is wound around a donut-shaped ferrite core through which passes one or more conductors for detecting a high current pulse within the conductors. An interface block includes a generally circular recessed upper portion for receiving the toroidal coil/ferrite core combination and further includes a pair of aligned, spaced slots extending between the upper and lower surfaces and within the recessed upper portion of the block. Each of the conductors is in the form of a strip-like metal conductor and is disposed within and along the length of a respective slot in the interface block. The upper end of each strip-like conductor is adapted for mounting to an upper portion of the interface block and coupling to a respective first lead by means of a first mounting screw. Similarly, the lower end of each strip-like conductor is adapted for mounting to a lower portion of the interface block and coupling to a respective second lead by means of a second mounting screw. The ends of the toroidal coil are positioned within a respective groove in a lateral portion of the interface block and extend to the lower surface thereof where they are connected to respective terminal pins for coupling the toroidal pick-up coil to appropriate circuitry on a printed circuit board.

13 Claims, 3 Drawing Sheets

CURRENT SENSOR ARRANGEMENT

BACKGROUND OF THE INVENTION

This invention relates generally to electrical current sensing arrangements and is particularly directed to the mounting and electrical coupling of a toroidally wound current pick-up coil.

One approach to detecting the current in a conductor is to position a magnetic field responsive coil adjacent to the conductor and measure current flow therein in response to changes in the magnetic field arising from current changes in the conductor. The pick-up coil frequently takes the form of a toroidally wound wire disposed around a donut-shaped ferrite core with the current carrying conductor passed through the ferrite core's aperture. This arrangement is particularly useful for detecting current pulses in the conductor.

A typical prior art current sensor arrangement incorporating a toroidally wound pick-up coil is shown in FIG. 1. The toroidally wound pick-up coil 10 is wrapped around a donut-shaped ferrite core 12. The combination of the toroidal coil 10 and ferrite core 12 is affixed to a support structure 18 which in FIG. 1 is represented as a transformer 18 by means of a hot melt epoxy cement 24. Disposed within the aperture in the toroidal coil and ferrite core combination may be one or more conductors within which it is desired to detect a current or current pulses. In FIG. 1, a first plurality of conductors 15 are shown disposed within a first insulating sheath 16 which is positioned within the aperture of the toroidal coil/ferrite core combination. A second sheath 22 within which may be disposed one or more windings of a choke 20 is also shown positioned within the toroidal coil 10. Changes in the magnetic flux arising from current variations within any of the aforementioned conductors or leads is sensed by the toroidal coil and ferrite core combination resulting in an electromagnetic potential being applied across the toroidal coil and a current induced therein. A pair of leads 17 extending from the toroidal coil 10 carries a current which represents the change in current within any of the conductors positioned within the toroidal coil and permits this current change to be detected and measured by conventional means which are not shown in FIG. 1.

The arrangement of FIG. 1 suffers from various limitations. For example, the conductors must be manually inserted through the combination of the toroidal coil 10 and ferrite core 12 and must then be coupled to associated circuitry. The toroidal coil/ferrite core combination must then be affixed to the conductors by means of the epoxy cement in a procedure which is inherently imprecise in terms of the positioning of the toroidal coil along the length of the conductors and with respect to other adjacent electronic components which may provide an unwanted magnetic field input to the pick-up coil. In addition, the positioning and mounting of the toroidal pick-up coil must be performed manually and thus represents a labor intensive, rather expensive approach. Moreover, manual application of the hot melt epoxy cement tends to be messy and imprecise. Finally, should the need arise to later replace the toroidal pick-up coil, the mounting arrangement of FIG. 1 is particularly undesirable since the pick-up coil has been more or less permanently affixed to its support structure.

The present invention is intended to overcome the aforementioned limitations of the prior art by providing a current sensor arrangement employing a toroidally wound pick-up coil which is positioned upon a mounting/connecting block or interface housing in a manner which ensures its secure mounting upon and electrical connection to a printed circuit (PC) board while providing for the automatic insertion within the pick-up coil of the conductor or conductors in which the current is to be detected.

OBJECTS OF THE INVENTION

Accordingly, it is an object of the present invention to provide an improved current sensing arrangement.

It is another object of the present invention to provide an integrated structure for supporting and electrically coupling a current carrying lead as well as a detector for sensing the current within the lead.

Yet another object of the present invention is to provide for the more stable and secure positioning of a ferromagnetic current sensor about a current carrying conductor.

A further object of the present invention is to simplify and reduce the cost of the installation and electrical connection of a current sensor about a current carrying conductor on a PC board.

A still further object of the present invention is to facilitate the installation and replacement of a toroidally-shaped current pick-up coil.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
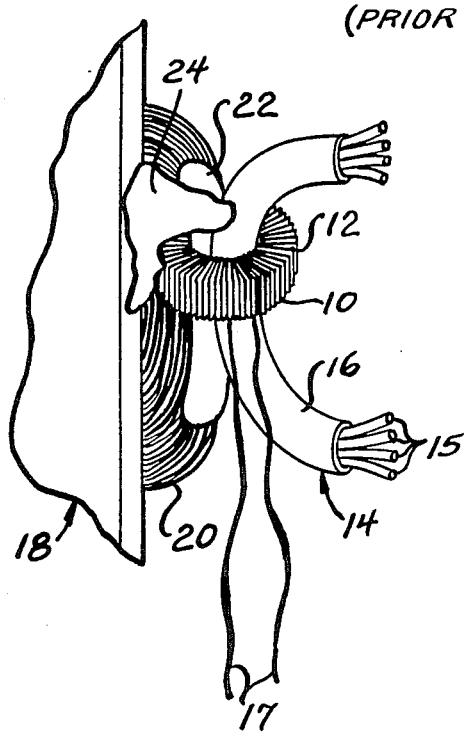
FIG. 1 is a perspective view of a typical prior art mounting arrangement for a toroidal pick-up coil.

Referring to FIGS. 2 through 5, there are shown various views of a current sensor arrangement 30 in accordance with the principles of the present invention. The current sensor arrangement 30 includes a mounting/connecting block, or interface housing, 32 adapted for mounting upon a printed circuit (PC) board 72. The PC board 72 typically includes a plurality of strip-like conductors located on one or both sides thereof which are coupled in circuit with various electronic components 74, 76. These conductors are not shown on the PC board 72 of FIG. 2 for simplicity.

The mounting/connecting block 32 is preferably comprised of a hard, durable plastic material and includes a plurality of legs or base members 33 adapted for positioning upon and engagement with the PC board 72. The mounting/connecting block 32 further includes a pair of facing curvilinear slots 38a and 38b positioned on an upper portion thereof and forming a generally circular recessed portion therein. The pair of curvilinear slots 38a, 38b is adapted to receive and support the combination of a donut-shaped ferrite core 36 and a toroidal coil 34 wound around the ferrite core. With the combination toroidal coil/ferrite core positioned within the curvilinear slots 38a, 38b in the upper portion of the mounting/connecting block 32, an upraised center portion 40 of the block is positioned within the ferrite core's aperture. Positioned within the upraised center portion 40 of the mounting/connecting block 32 and extending downward to the lower surface thereof are a pair of slots 42a, 42b. Each of the slots 42a, 42b is adapted to receive a respective conductor 44a, 44b which are each in the form of a metal strip or bus bar in a preferred embodiment. Each of the metal strip conductors 44a, 44b is initially L-shaped and includes respective pairs of apertures 50a, 50b and 52a, 52b positioned on respective ends thereof. With the generally vertically oriented portion of each of the metal strip conductors 44a, 44b positioned within one of the mounting/connecting block slots 42a, 42b, the generally horizontally oriented portion of each of the metal strip conductors is positioned parallel and immediately adjacent to the lower surface of the mounting/connecting block 32.

Figure 2:
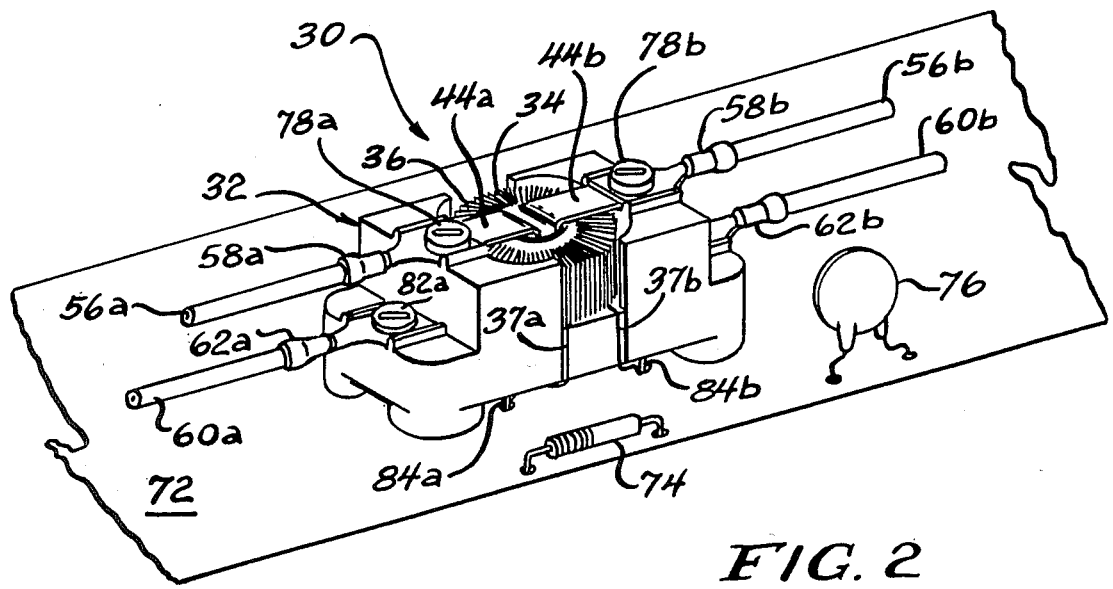
FIG. 2 is a perspective view of a current sensor arrangement in accordance with the principles of the present invention.
Figure 3:
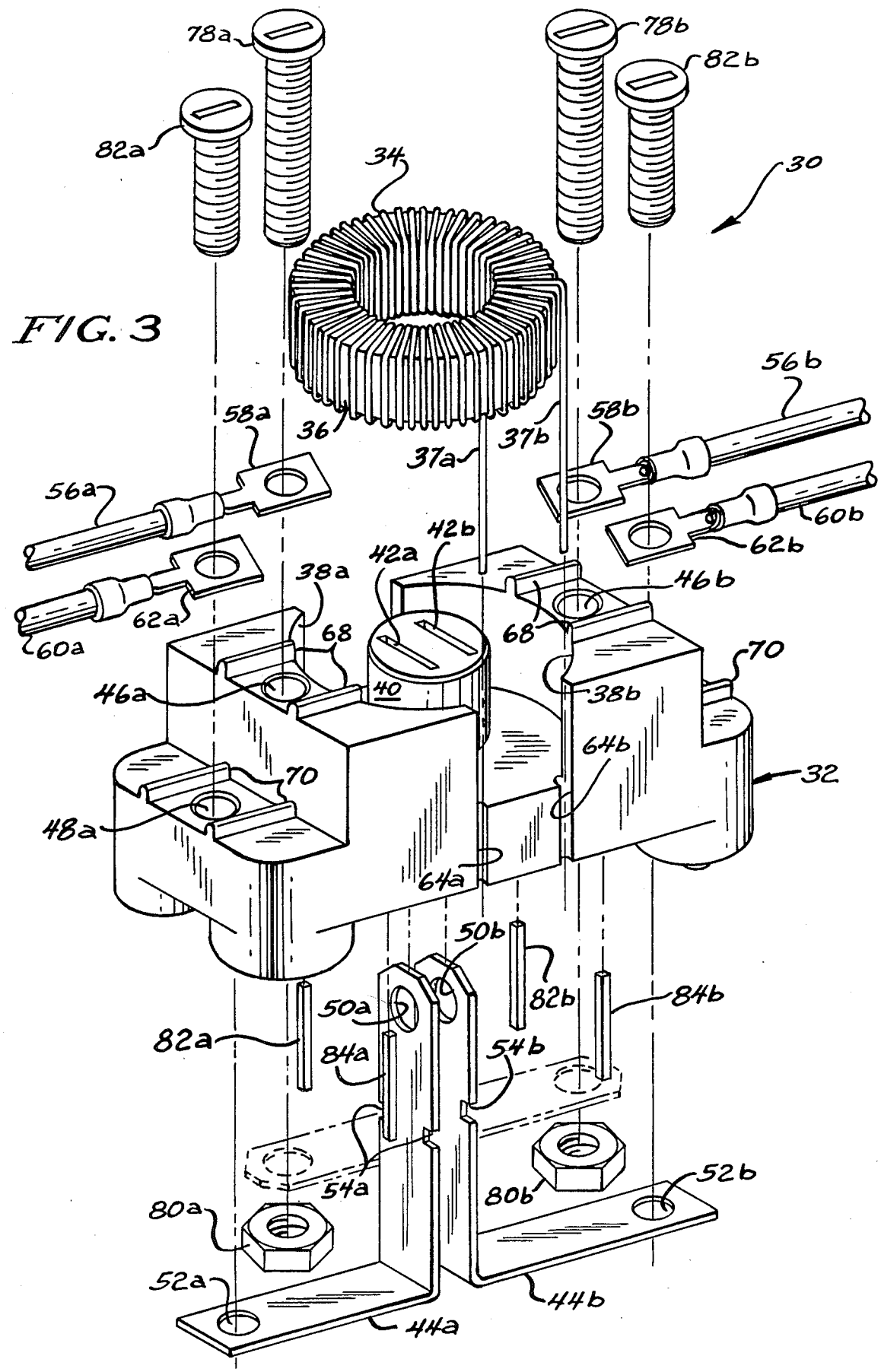
FIG. 3 is an exploded perspective view of the current sensor arrangement of FIG. 2.

Each of the metal strip conductors 44a, 44b further includes a respective pair of aligned notches 54a and 54b in the lateral edges thereof. With the generally vertically oriented portion of each of the metal strip conductors 44a, 44b inserted within a respective slot 42a, 42b within the mounting/connecting block 32, the notches 54a, 54b therein facilitate bending of each of the metal strip conductors so as to form another approximately 90° angle therein as illustrated in FIG. 2 and shown in dotted line form in FIG. 3. With each of the metal strip conductors 44a, 44b thus bent following insertion within a respective mounting/connecting block slot 42a, 42b, the metal strip conductors maintain the toroidal coil/ferrite core combination within the upper recessed portion of the mounting/connecting block 32. With the toroidal coil/ferrite core combination thus positioned within the upper recessed portion of the mounting/connecting block 32, a pair of leads 37a, 37b extending from the toroidal coil 34 may be positioned within a respective lateral slot 64a, 64b within the mounting/connecting block 32. Lower end portions of the toroidal coil leads 37a, 37b are adapted for coupling to respective electrical coupling pins 84a, 84b mounted to a lower portion of the mounting/connecting block 32 as described below.

Figure 4:
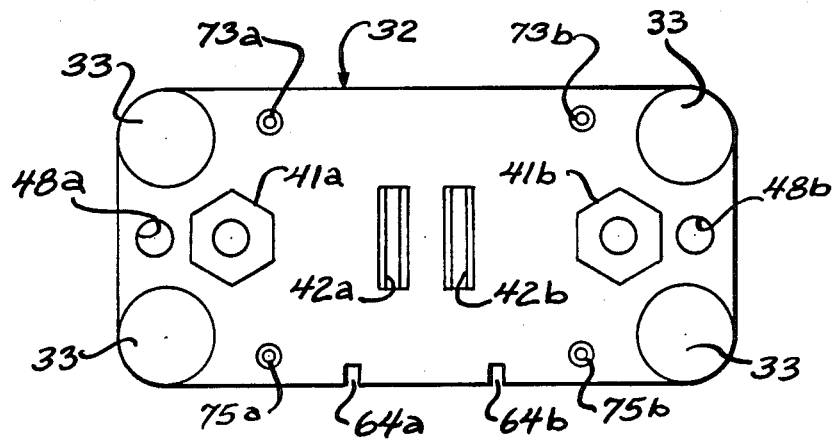
FIG. 4 is a bottom plan view of a mounting/connecting block for use in the current sensor arrangement of the present arrangement.
Figure 5:
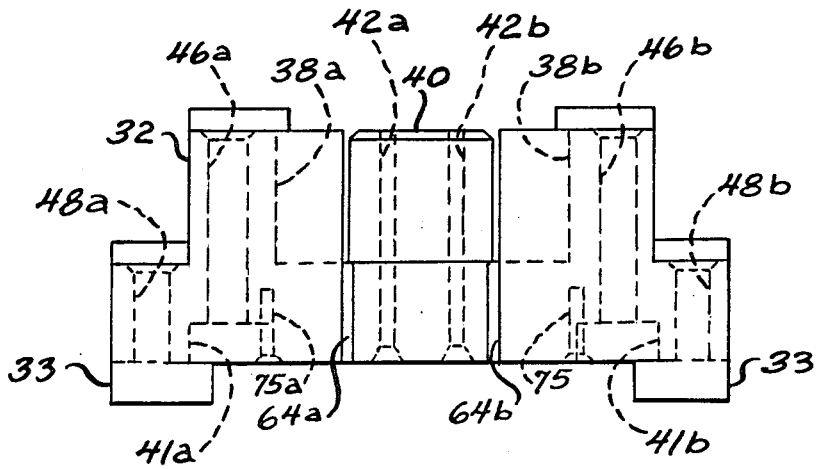
FIG. 5 is a lateral view shown partially in phantom of the mounting/connecting block shown in FIG. 4.

The mounting/connecting block 32 further includes a pair of inner apertures or slots 46a, 46b therein which are located immediately adjacent to the upper recessed portion thereof. With the upper portions of each of the metal strip conductors 44a, 44b thus bent so as to form a generally 90° angle, the respective apertures 50a, 50b therein are aligned with the inner apertures 46a, 46b of the mounting/connecting block 32. With each of the metal strip conductors 44a, 44b thus positioned within and upon the mounting/connecting block 32, respective coupling lugs 58a, 58b connected to associated upper leads 56a, 56b may be positioned in contact with the upper end portion of a metal strip conductor and over a respective inner aperture 46a, 46b within the mounting/connecting block. With the apertures 50a, 50b in each of the metal strips 44a, 44b positioned over a respective inner aperture 46a, 46b within the mounting/connecting block 32 and aligned with a corresponding aperture in one of the coupling lugs 58a, 58b, upper mounting pins 78a, 78b may be inserted through each pair of aligned apertures and positioned within a respective inner aperture 46a, 46b in the mounting/connecting block. As shown in FIGS. 4 and 5, the lower portion of the mounting/connecting block 32 includes a pair of spaced recessed portions 41a, 41b each adapted to receive a respective mounting nut 80a, 80b. By securing each of the mounting pins 78a, 78b on the mounting/connecting block 32 by means of a respective mounting nut 80a, 80b, the upper end portions of each of the metal strip conductors 44a, 44b may be electrically coupled to a corresponding electrical lead 56a, 56b and securely mounted to an upper portion of the mounting/connecting block. The upper portions of the mounting/connecting block 32 immediately adjacent to the curvilinear slots 38a, 38b therein are each provided with a respective pair of facing alignment/retention ribs 68. Each pair of alignment/retention ribs 68 is disposed on facing sides of the inner apertures 46a, 46b within the mounting/connecting block 32 and serves to align respective apertures within the upper end portions of the metal strip conductors 44a, 44b with the apertures in the first and second coupling lugs 58a, 58b as well as with the block's inner apertures 46a, 46b.

The lateral end portions of the mounting/connecting block 32 are each provided with a respective outer aperture 48a, 48b therein. With each of the metal strip conductors 44a, 44b positioned within a respective slot 42a, 42b within the mounting/connecting block 32, the lower apertures 52a, 52b within the metal strip conductors are aligned with a respective outer aperture 48a, 48b within the mounting/connecting block. The lower apertures 52a, 52b of the strip conductors are adapted to engage a respective lower mounting pin 82a, 82b inserted within a respective outer aperture 48a, 48b in the mounting/connecting block 32. Positioned immediately adjacent to each of the outer apertures 48a, 48b within the mounting/connecting block 32 are a pair of spaced lower alignment/retention ribs 70 which are adapted to receive a respective third and fourth coupling lug 62a, 62b so as to position respective apertures therein in alignment with a corresponding outer aperture within the mounting/connecting block. Each of the third and fourth coupling lugs 62a, 62b is coupled to a respective third and fourth lower lead 60a, 60b. With the third and fourth coupling lugs 62a, 62b positioned between a respective pair of lower alignment/retention ribs 70 such that its aperture is in alignment with a corresponding outer aperture 48a, 48b in the mounting/connecting block 32, a lower mounting pin 82a, 82b may be inserted within a respective aperture and is threadably engaged by a respective aperture 52a, 52b in one of the metal strip conductors 44a, 44b. In this manner, the lower ends of the metal strip conductors 44a, 44b may be securely mounted to a lower portion of the mounting/connecting block 32 and electrically coupled to a respective lower lead 60a, 60b. The legs 33 positioned on the lower portion of the mounting/connecting block 32 provide the required displacement between the mounting/connecting block and the upper surface of the PC board 72 to accommodate positioning of the lower portions of the metal strip conductors 44a, 44b between the PC board and the lower surface of the mounting/connecting block.

There are provided on the lower surface of the mounting/connecting block 32 first and second pairs of slots 73a, 73b and 75a, 75b as shown in FIG. 4. Each of the slots 73a, 73b is adapted to receive in tight fitting engagement a respective electrical coupling pin 84a, 84b. With each of the toroidal coil leads 37a, 37b coupled to a respective one of the electrical coupling pins 84a, 84b and with each of the electrical coupling pins connected to circuitry on the PC board 72, the toroidal coil 34 may be coupled to appropriate circuitry on the PC board. Similarly, the second pair of slots 75a, 75b in the lower portion of the mounting/connecting block 32 are each adapted to receive in tight fitting engagement a respective mounting pin 82a, 82b for permitting the current sensor arrangement 30 to be securely mounted in a stable manner upon the PC board 72. With an electrical current established between upper lead 56a and lower lead 60a via metal strip conductor 44a or between upper lead 56b and lower lead 60b via metal strip conductor 44b, changes in the current within either one of these conductors will induce an electrical current or a change in electrical current within the toroidal coil 34 which may be provided via leads 37a and 37b to appropriate current sensing circuitry (not shown) on the PC board 72.

There has thus been shown an improved current sensor arrangement for detecting current or current pulses in a conductor by means of a toroidal coil and ferrite core combination disposed about the conductor and securely mounted to a mounting/connecting block or housing. The mounting/connecting block is adapted for secure positioning upon and electrical coupling to a PC board and also facilitates coupling of the conductor to a pair of electrical leads. The inventive current sensor arrangement provides for secure positioning of sensor components upon a PC board by automatic positioning and mounting equipment and facilitates replacement of the sensor toroidal coil/ferrite core combination in the event of malfunction of either of these components.

While particular embodiments of the present invention have been shown and described, it will be obvious to those skilled in the art that changes and modifications may be made without departing from the invention in its broader aspects. For example, while the present invention is shown in terms of detecting current in two conductors, this invention is not limited to such an arrangement and is adapted for detecting current in a single conductor or in virtually any number of conductors positioned within the toroidal coil/ferrite core combination. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A current sensing arrangement mounted on a PC board comprising:
   a toroidal-shape ferrite core having an aperture therein;
   a pick-up coil cound around said ferrite core and disposed about the aperture therein;
   a unitary housing having a curvilinear recessed upper portion comprised of a pair of generally semicircular, spaced, facing notches in an upper portion of said housing defining an upraised portion of said housing therebetween and adapted to receive and engage said ferrite core and said pick-up coil disposed thereon;
   a slot extending through said housing from top to bottom and positioned within the upraised portion thereof;
   a current carrying conductor positioned within the slot in said housing and disposed within said ferrite core and said pick-up coil; and
   first and second coupling means for securely connecting respective ends of said conductor to respective electrical leads and for securely mounting the thus connected ends of said conductor and electrical leads to said housing.

2. The current sensing arrangement of claim 1 further comprising mounting means for securely mounting said housing to a support structure.

3. The current sensing arrangement of claim 2 wherein said support structure is a PC board having a plurality of apertures and said mounting means includes a plurality of mounting pins connected to a lower portion of said housing and inserted through respective apertures in said PC board.

4. The current sensing arrangement of claim 3 further comprising a plurality of coupling pins mounted to a lower portion of said housing for coupling said pick-up coil in circuit with said PC board.

5. The current sensing arrangement of claim 4 wherein said housing includes a pair of lateral grooves therein for receiving respective end portions of said pick-up coil connected to said coupling pins.

6. The current sensing arrangement of claim 1 wherein said conductor and said housing are respectively provided with first and second pairs of apertures for respectively receiving said first and second coupling means.

7. The current sensing arrangement of claim 6 wherein said first and second coupling means respectively include first and second threaded coupling pins.

8. The current sensing arrangement of claim 7 wherein said first coupling means further includes a nut for threadably engaging said first coupling pin and said second coupling means includes a threaded aperture in said conductor for threadably engaging said second coupling pin.

9. The current sensing arrangement of claim 8 wherein each electrical lead includes a lug on an end thereof and wherein each of said lead lugs is engaged by a respective coupling pin.

10. The current sensing arrangement of claim 1 wherein said housing is plastic.

11. The current sensing arrangement of claim 1 wherein said housing further comprises a plurality of slots within the curvilinear recessed upper portion thereof and wherein each slot contains a respective current carrying conductor.

12. The current sensing arrangement of claim 11 wherein each conductor is in the form of an elongated, flat conductive strip.

13. The current sensing arrangement of claim 12 wherein each of said elongated, flat strips is generally C-shaped and comprised of first and second end portions and an intermediate portion and wherein said intermediate portion is positioned within a respective housing slot and said first and second end portions are respectively positioned adjacent to upper and lower portions of said housing.

* * * * *